(12) United States Patent
Hui et al.

(10) Patent No.: US 6,514,867 B1
(45) Date of Patent: Feb. 4, 2003

(54) METHOD OF CREATING NARROW TRENCH LINES USING HARD MASK

(75) Inventors: Angela T. Hui, Fremont, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/817,586

(22) Filed: Mar. 26, 2001

(51) Int. Cl.[7] .............................................. H01L 21/00
(52) U.S. Cl. ...................... 438/713; 216/67; 257/437; 438/720; 438/724; 438/740
(58) Field of Search ................... 438/713, 717, 438/720, 723, 724, 740, 736, 743; 216/67; 257/437

(56) References Cited

U.S. PATENT DOCUMENTS

| | | | |
|---|---|---|---|
| 4,487,652 A | * 12/1984 | Almgren ................. | 438/717 X |
| 4,560,436 A | 12/1985 | Bukhman et al. ............ | 156/643 |
| 5,753,418 A | * 5/1998 | Tsai et al. ................ | 438/713 X |
| 5,776,836 A | 7/1998 | Sandhu ........................ | 438/717 |
| 5,821,169 A | * 10/1998 | Nguyen et al. ............. | 438/736 |
| 5,913,148 A | * 6/1999 | Hills ....................... | 438/713 X |

* cited by examiner

*Primary Examiner*—William A. Powell
(74) *Attorney, Agent, or Firm*—Foley & Lardner

(57) ABSTRACT

An exemplary method is described which forms narrow trench lines having a critical dimension which is smaller than the critical dimension possible using conventional lithographic techniques. This method can include providing a hard mask over a layer of material in which a trench line is to be formed; etching the hard mask with a first critical dimension at the top of the hard mask and a second critical dimension at the bottom of the hard mask; and etching a trench line using the hard mask to transfer the second critical dimension to the trench line.

20 Claims, 2 Drawing Sheets

METHOD OF CREATING NARROW TRENCH LINES USING HARD MASK

CROSS REFERENCE TO RELATED APPLICATIONS

The present application is related to pending U.S. patent application Ser. No. 09/817,911, entitled METHOD OF CREATING A SMALLER CONTACT USING HARD MASK, filed on the same day by the same inventors and assigned to the same assignee as this application.

FIELD OF THE INVENTION

The present invention relates generally to the field of integrated circuits and to methods of manufacturing integrated circuits. More particularly, the present invention relates to a method of creating narrow trench lines using a hard mask.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC.

One limitation to achieving smaller sizes of IC device features is the capability of conventional lithography. In general, projection lithography refers to processes for pattern transfer between various media. According to conventional projection lithography a silicon slice, the wafer, is coated uniformly with a radiation-sensitive film or coating, the photoresist. An exposing source of radiation (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to projection lithography is EUV lithography. EUV lithography reduces feature size of circuit elements by lithographically imaging them with radiation of a shorter wavelength. "Long" or "soft" x-rays (a.k.a., extreme ultraviolet (EUV)), wavelength range of lambda=50 to 700 angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently will absorb some of the EUV radiation. The absorbed EUV radiation results in heating of the reticle. As the reticle increases in temperature, mechanical distortion of the reticle may result due to thermal expansion of the reticle.

Both conventional projection and EUV lithographic processes are limited in their ability to print small features, such as, contacts, trenches, polysilicon lines or gate structures. As such, the critical dimensions of IC device features, and, thus, IC devices, are limited in how small they can be.

Thus, there is a need to pattern IC devices using non-conventional lithographic techniques. Further, there is a need to form smaller feature sizes, such as, smaller trench lines. Yet further, there is a need to use etch profile variation to create a tapered angle to offset the critical dimension for narrower trench lines.

SUMMARY OF THE INVENTION

An exemplary embodiment of the invention is related to a method of forming narrow trench lines having a critical dimension which is smaller than the critical dimension possible using conventional lithographic techniques. This method can include providing a hard mask over a layer of material in which a trench line is to be formed; etching the hard mask with a first critical dimension at the top of the hard mask and a second critical dimension at the bottom of the hard mask; and etching a trench line using the hard mask to transfer the second critical dimension to the trench line.

Briefly, another exemplary embodiment is related a method of manufacturing an integrated circuit. This method can include patterning a standard feature size on an anti-reflective coating (ARC) layer disposed over an inter-level dielectric (ILD) layer; etching the patterned metal layer and ARC layer to create a tapered profile in the ARC layer; and etching a trench line in the ILD layer using the patterned ARC layer as the hard mask. The etched trench line in the ILD layer is narrower than the standard feature size due to the tapered profile in the ARC layer.

Briefly, another embodiment is related to an integrated circuit having trench lines. The integrated circuit is manufactured by an advantageous method which can include providing a hard mask over a layer of material in which a trench line is to be formed; etching the hard mask with a first critical dimension at the top of the hard mask and a second critical dimension at the bottom of the hard mask; and etching a trench line using the hard mask to transfer the second critical dimension to the trench line.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
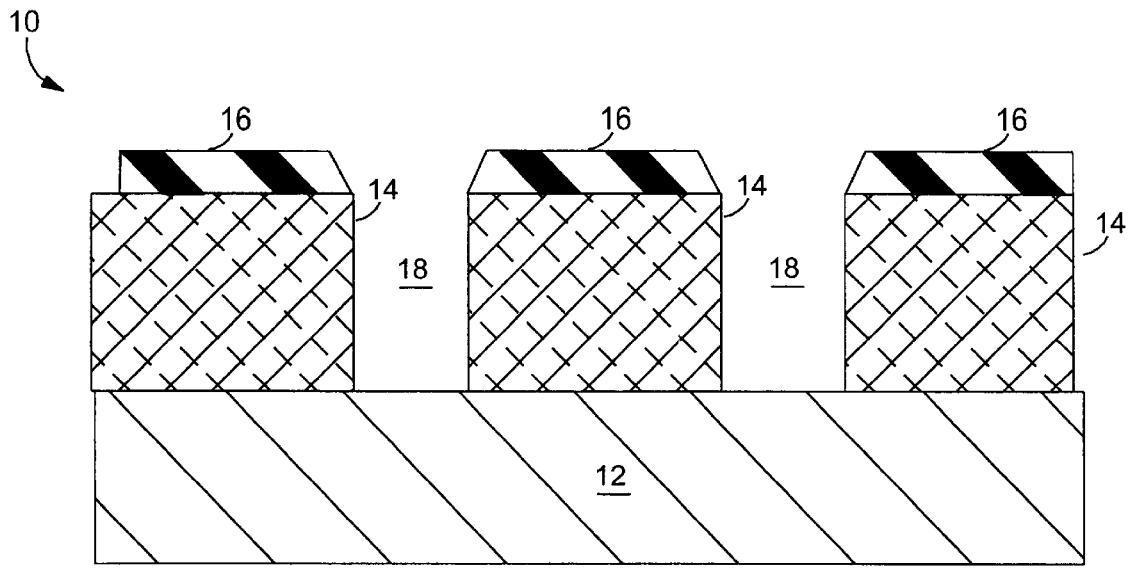
FIG. 1 is cross-sectional view of a portion of an integrated circuit fabricated in accordance with an exemplary embodiment of the present invention.

Referring to FIG. 1, a cross-sectional view of a portion 10 of an integrated circuit (IC) includes a substrate 12, an inter-level dielectric (ILD) layer 14, anti-reflective coating (ARC) features 16, and trench lines 18. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 can be CoSi or NiSi for low resistance and is preferably single crystal silicon. ILD layer 14 can include oxide or any other suitable material having a low dielectric constant k. Preferably, layer 14 is tetraethyl orthosilicate (TEOS) deposited silicon dioxide. ARC features 16 can include silicon nitride ($Si_3N_4$), silicon oxynitride (SiON), or any other suitable material having reflective properties. ARC features 16 are located on top of ILD layer 14.

In an exemplary embodiment, trench lines 18 are used to provide electrical isolation between devices fabricated on the same piece of silicon. One isolation technique often employed to electrically insulate or isolate various portions or structures of the semiconductor device from other portions of the device is trench isolation. The width of trench lines used as isolation structures is important because it affects the number of IC devices that can fit on a single chip. The smaller the trench lines are, the more IC devices that can fit on the integrated circuit wafer.

Advantageously, trench lines 18 have a critical dimension which is smaller than what is possible using conventional lithographic techniques. In one embodiment, the critical dimension of trench lines 18 is 2400 Angstroms in width. Indeed, using the tapered hard mask technique described herein, trench lines 18 have a critical dimension smaller than 2000 Angstroms in width.

Figure 2:
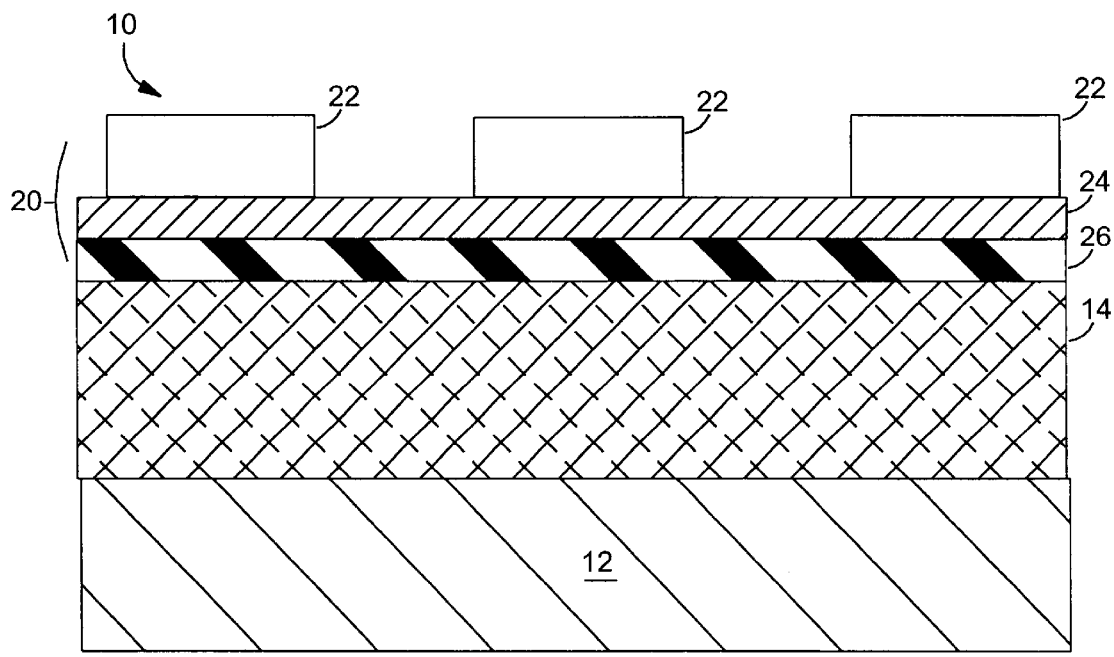
FIG. 2 is a cross-sectional view of a portion of an integrated circuit, showing a hard mask used in an exemplary method of manufacturing the integrated circuit illustrated in FIG. 1.

An exemplary method of forming portion 10 is described below with reference to FIGS. 1–4. This method advantageously forms portion 10 having trench lines with small critical dimensions. In FIG. 2, a cross-sectional view of portion 10 illustrates a hard mask 20 used in an exemplary method of fabrication of portion 10. A hard mask is a material with a high etching resistance which is used to "mask" or cover material which is intended not to be etched or removed. Hard mask 20 can include a metal layer 24 and an anti-reflective coating (ARC) layer 26 disposed over ILD layer 14. Features 22 can be made from a layer of photoresist material and patterned with the standard feature.

ARC layer 26 can be silicon nitride ($Si_3N_4$), silicon oxynitride (SiON), or any other suitable material having reflective properties. In one embodiment, features 22 are 4000–8000 Angstroms thick and ARC layer 26 is 500–1000 Angstroms thick.

Figure 3:
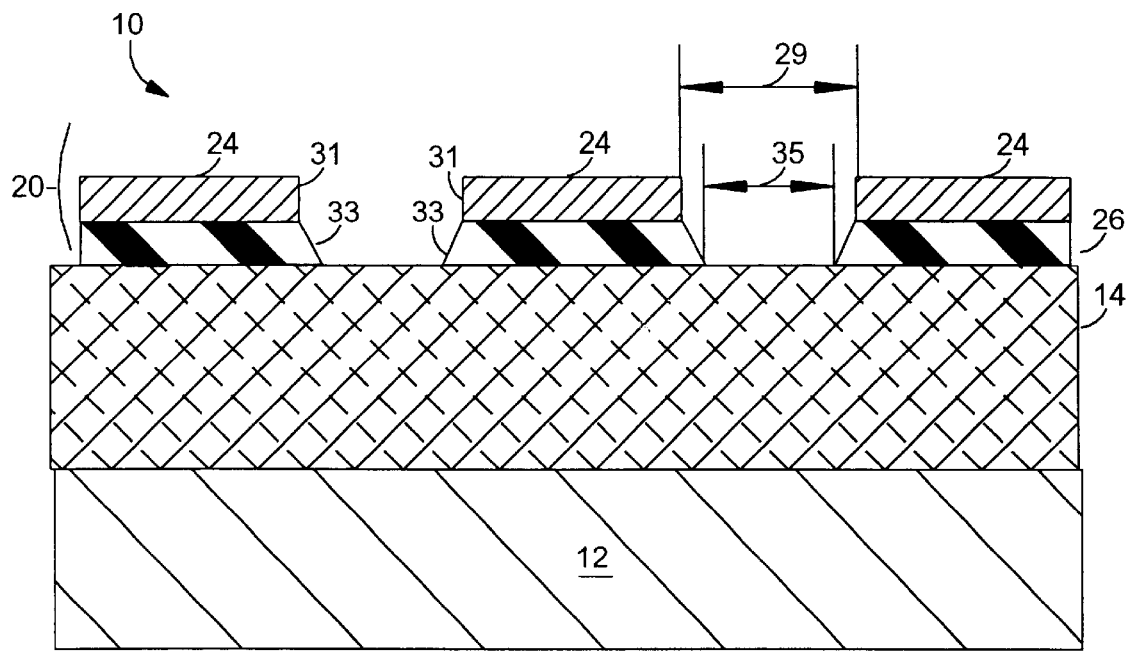
FIG. 3 is a cross-sectional view of a portion of an integrated circuit, showing a hard mask after a patterning and etching step has been performed in an exemplary method of manufacturing the integrated circuit illustrated in FIG. 1.

In FIG. 3, a cross-sectional view of portion 10 illustrates hard mask 20 after a patterning and etching step has been performed in which ARC layer 26 is patterned and etched. The etching stops on ILD layer 14. Patterning and etching of ARC layer 26 can be done using a variety of techniques. One patterning technique involves the use of a photoresist layer (layer 22) which is applied to select the sections of ARC layer 26 which are to be removed. The photoresist layer is removed or stripped once the patterning and etching has been completed. Steps in the patterning process are not illustrated in the FIGURES. In an exemplary embodiment, a plasma etch is used in the etching step. Alternatively, other etching processes may be used, such as, dry etching.

Using $Cl_2$/HBr chemistry, ARC layer 26 is etched with a tapered angle. The amount of CD shrinkage can be controlled by the tapered angle and thickness of ARC layer 26. The thicker ARC layer 26 is, the larger the amount of the CD shrinkage possible. Tapered profile 33 results despite the patterning of standard conventional feature size critical dimension 29. At the bottom of tapered profile 33, there is a narrower critical dimension 35. Advantageously, narrower critical dimension 35 allows narrower trench lines to be formed in ILD layer 14.

Figure 4:
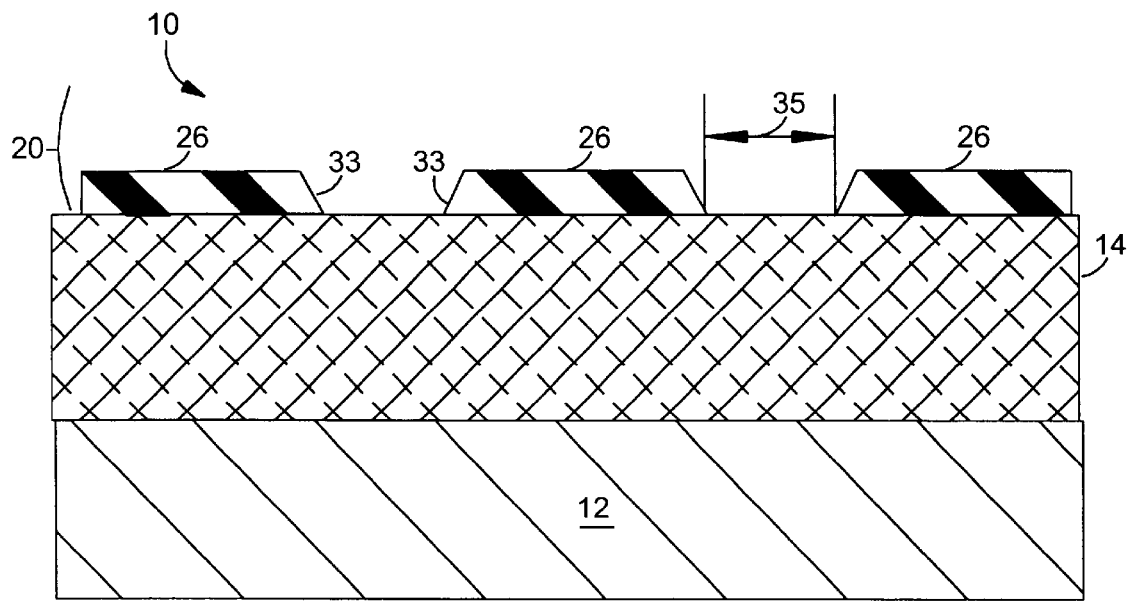
FIG. 4 is a cross-sectional view of a portion of an integrated circuit, showing a hard mask used to transfer a pattern in an exemplary method of manufacturing the integrated circuit illustrated in FIG. 1.

In FIG. 4, ARC layer 26 is used as a hard mask to transfer the pattern (i.e., the width) of narrower critical dimension 35 to ILD layer 14. The etch chemistry used to transfer the pattern from ARC layer 26 is any of a variety of etching techniques. In one embodiment, the etch chemistry used is a plasma etch technique. Advantageously, the transfer of the pattern from ARC layer 26 results in smaller critical dimensions for trench lines 18 (described with reference to FIG. 1) than possible using conventional lithography. Further, the method described with reference to FIGS. 1–4 avoids the feature size limitations inherent to conventional lithography.

While the embodiments illustrated in the FIGURES and described above are presently preferred, it should be understood that these embodiments are offered by way of example only. Other embodiments may include, for example, different methods of patterning or etching various layers as well as different combinations of materials and layers in hard mask 20. The invention is not limited to a particular embodiment, but extends to various modifications, combinations, and permutations that nevertheless fall within the scope and spirit of the appended claims.

What is claimed is:

1. A method of forming narrow trench lines having a critical dimension which is smaller than the critical dimension possible using lithographic techniques, the method comprising:

providing a hard mask comprising an anti-reflective coating (ARC) material comprising nitrogen over a layer of material in which a narrow trench line is to be formed, the hard mask having a top and a bottom;

etching the hard mask with a first critical dimension at the top of the hard mask and a second critical dimension at the bottom of the hard mask; and etching a trench line using the hard mask to transfer the second critical dimension to the trench line.

2. The method of claim 1, wherein the hard mask comprises an anti-reflective coating (ARC) layer and a resist layer.

3. The method of claim 2, wherein the step of etching a trench line comprises using a plasma etch.

4. The method of claim 1, wherein the first critical dimension is 1600–2400 Angstroms (Å).

5. The method of claim 1, wherein the second critical dimension is 1000–1800 Angstroms (Å).

6. The method of claim 1, wherein the step of etching the hard ask comprises performing a dry etch.

7. A method of manufacturing an integrated circuit comprising:

patterning a standard feature size on an anti-reflective coating (ARC) layer including nitrogen disposed over an inter-level dielectric (ILD) layer;

etching the patterned ARC layer, the etching process creating a tapered profile in the ARC layer; and etching a trench line using the patterned ARC layer as a hard mask, the trench line being narrower than the standard feature size due to the tapered profile in the ARC layer.

8. The method of claim 7, wherein the ARC layer is any one of SiON, SiN, and SiRN.

9. The method of claim 7, wherein the step of etching the patterned ARC layer comprises using $Cl_2$/HBr chemistry.

10. The method of claim 7, further comprising providing a resist layer disposed over the ARC layer.

11. The method of claim 10, further comprising stripping the resist layer.

12. The method of claim 7, wherein the standard feature size is 1600–2400 Angstroms (Å).

13. The method of claim 7, wherein the width of the trench line is less than one minimum lithographic feature.

14. The method of claim 7, wherein the tapered profile has an angle of 65–85 degrees.

15. An integrated circuit having trench lines, the integrated circuit manufactured by a method comprising:

providing a hard mask comprising an anti-reflective coating (ARC) material having nitrogen over a layer of material in which a trench line is to be formed, the hard mask having a top and a bottom;

etching the hard mask with a first critical dimension at the top of the hard mask and a second critical dimension at the bottom of the hard mask; and etching a trench line using the hard mask to transfer the second critical dimension to the trench line.

16. The integrated circuit manufactured by the method of claim 15, wherein the hard mask has a thickness of 500–1000 Angstroms (Å).

17. The integrated circuit manufactured by the method of claim 15, wherein the layer of material in which a trench line is formed comprises an inter-level dielectric.

18. The integrated circuit manufactured by the method of claim 15, wherein the layer of material in which a trench line is formed comprises an oxide.

19. The integrated circuit manufactured by the method of claim 15, wherein the second critical dimension is 1000–1800 Angstroms (Å).

20. The integrated circuit manufactured by the method of claim 15, wherein the hard mask comprises a metal material provided over the ARC material.

\* \* \* \* \*